(12) United States Patent
Butzmann et al.

(10) Patent No.: US 9,903,905 B2
(45) Date of Patent: Feb. 27, 2018

(54) SEMICONDUCTOR SWITCH AND METHOD FOR DETERMINING A CURRENT THROUGH A SEMICONDUCTOR SWITCH

(71) Applicant: Robert Bosch GmbH, Stuttgart (DE)

(72) Inventors: Stefan Butzmann, Schalkmühle (DE); Holger Sievert, Ludwigsburg (DE); Peter Feuerstack, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/115,301

(22) PCT Filed: Nov. 27, 2014

(86) PCT No.: PCT/EP2014/075774
§ 371 (c)(1),
(2) Date: Jul. 29, 2016

(87) PCT Pub. No.: WO2015/113672
PCT Pub. Date: Aug. 6, 2015

(65) Prior Publication Data
US 2017/0010318 A1 Jan. 12, 2017

(30) Foreign Application Priority Data
Jan. 29, 2014 (DE) .................. 10 2014 201 584

(51) Int. Cl.
*G01R 31/26* (2014.01)
*H03K 17/567* (2006.01)
(Continued)

(52) U.S. Cl.
CPC ...... *G01R 31/2633* (2013.01); *H01L 29/7393* (2013.01); *H03K 17/18* (2013.01); *H03K 17/567* (2013.01); *H03K 2217/0027* (2013.01)

(58) Field of Classification Search
CPC .. G01R 31/2633; H03K 17/567; H03K 17/18; H03K 2217/0027; H01L 29/7393
See application file for complete search history.

(56) References Cited

U.S. PATENT DOCUMENTS 5,422,593 A * 6/1995 Fujihira .................. G05F 1/573
327/427
2002/0141126 A1 10/2002 Tabata
(Continued)

FOREIGN PATENT DOCUMENTS

EP 0467681 1/1992
EP 0599605 6/1994

OTHER PUBLICATIONS

International Search Report for Application No. PCT/EP2014/075774 dated Feb. 24, 2015 (English Translation, 2 pages).

*Primary Examiner* — Jermele M Hollington
*Assistant Examiner* — Zannatul Ferdous
(74) *Attorney, Agent, or Firm* — Michael Best & Friedrich LLP

(57) ABSTRACT

The invention relates to a semiconductor switch and to a method for determining a current in the power path of a semiconductor switch. For this purpose, a semiconductor switch, according to the invention, has a plurality of sense connections, wherein each of said sense connections provides an individual output signal that is proportional to the current in the power path of the semiconductor switch. The evaluation of the current in the power path can be optimized by the appropriate selection of one of the plurality of sense connections in accordance with the current in the power path of the semiconductor switch.

8 Claims, 4 Drawing Sheets

(51) Int. Cl.
  *H01L 29/739* (2006.01)
  *H03K 17/18* (2006.01)

(56) References Cited

U.S. PATENT DOCUMENTS

2007/0200590 A1* 8/2007 Lalithambika ..... G01R 19/0092
                                              324/133
2011/0025288 A1* 2/2011 Balakrishnan .... H02M 3/33507
                                              323/284

* cited by examiner

SEMICONDUCTOR SWITCH AND METHOD FOR DETERMINING A CURRENT THROUGH A SEMICONDUCTOR SWITCH

BACKGROUND OF THE INVENTION

The present invention relates to a semiconductor switch and a method for determining a current between an input terminal and an output terminal of a semiconductor switch.

For measuring and evaluating a current through a semiconductor switch, such as through an IGBT module (IGBT=insulated gate bipolar transistor), for example, it is known to provide the semiconductor switch with an additional sense terminal. In this case, the current provided at said sense terminal is approximately proportional to the main current through the semiconductor switch.

The European patent application EP 0 467 681 A2 discloses a drive circuit for such an IGBT comprising a sense terminal for determining an emitter current. On the basis of the current intensity thus determined, a control voltage at the IGBT is adapted in order to avoid overcurrents.

Since the relationship between collector-emitter current and collector-emitter voltage of such an IGBT is nonlinear, the transfer ratio between emitter current and sense current is also approximately constant only if the voltage between collector and emitter is identical to the voltage between collector and sense terminal. In order to set these required voltage ratios correctly, the sense terminal is loaded by a suitable compensation circuit with a current such that the collector-emitter voltage and the collector-sense voltage are equal in magnitude.

In this case, it is a challenge to find a suitable translation ratio between emitter current and sense current. If, proceeding from very high maximum or peak currents, a relatively large translation ratio is chosen, then the required accuracy in the case of small currents can be achieved only to a limited extent since disturbance effects of the IGBT, offset errors of the evaluation circuit and tolerances of the components have a relatively large influence in this case. By contrast, in the case of a small translation ratio, although a high accuracy can be achieved for low currents, the compensation current at the sense terminal also increases. Furthermore, even very high maximum currents may possibly no longer be measured correctly since the current output signal can encounter a limitation in this case.

Therefore, there is a need for a semiconductor switch whose power current can be determined reliably and efficiently over a large dynamic range.

SUMMARY OF THE INVENTION

In one aspect the present invention provides a semiconductor switch, comprising an input terminal; an output terminal; and a control terminal designed to set a current between the input terminal and the output terminal on the basis of a voltage signal present at the control terminal; and a plurality of sense terminals designed in each case to provide a current that is proportional to the current flowing between the input terminal and the output terminal.

In accordance with a further aspect, the present invention provides a method for determining a current between an input terminal and an output terminal of a semiconductor switch, comprising the following steps: providing a semiconductor switch comprising a plurality of sense terminals designed in each case to provide a current that is proportional to the current flowing between the input terminal and the output terminal; selecting one of the plurality of sense terminals; outputting a voltage signal using the current provided at the selected sense terminal.

The present invention is based on the concept of evaluating a current in the power path of a semiconductor switch not just on the basis of a single corresponding measurement signal, but rather of providing and evaluating a plurality of different measurement signals for the evaluation of the current in the power path. In this way, different measurement signals may be provided and evaluated for different measurement ranges. Each of said individual measurement signals may be adapted in an optimized manner here for a different measurement range. A very precise determination of the current in the power path of the semiconductor switch over a very wide dynamic range is possible in this way.

Consequently, on the one hand, in the case of a relatively low current in the power path it is possible to provide a comparatively sensitive measurement signal which counteracts possible disturbance effects of the semiconductor switch, an offset error that possibly occurs or large component tolerances. On the other hand, in the case of relatively high currents in the power path of the semiconductor switch it is possible to provide a measurement signal which does not require a high compensation current. In this way, the energy consumption can be decreased and the risk that an evaluation circuit for the measurement signals provided will encounter a limitation can be reduced.

In accordance with one embodiment, the currents provided at the plurality of sense terminals are different. Consequently, for different measurement ranges it is possible to provide a respective current signal at the different sense terminals which has been optimized for the individual measurement ranges.

In accordance with one embodiment, the semiconductor switch is embodied as an insulated gate bipolar transistor (IGBT). Such IGBTs are particularly well suited as semiconductor switches, wherein at the same time it is possible to provide measurement signals for current evaluation.

In accordance with one embodiment, the semiconductor switch furthermore comprises an evaluation circuit designed to output a voltage signal using at least one of the currents provided by the plurality of sense terminals. The use of such an evaluation circuit means that a voltage signal suitable for further evaluation and processing can be generated from the current signals provided at the sense terminals.

In accordance with one embodiment, the evaluation circuit comprises a control terminal, wherein the evaluation circuit is designed to select one of the plurality of sense terminals depending on a signal present at the control terminal, and wherein the voltage signal is output using the current from the thus selected sense terminal. In this way, by suitably driving said control terminal of the evaluation circuit it is possible in each case to select a suitable sense terminal of the semiconductor switch and thus to switch over between different sense terminals of the semiconductor switch.

In accordance with one embodiment, the evaluation circuit is designed to select one of the plurality of sense terminals depending on a current output at the sense terminals. This selection of one of the sense terminals on the basis of the present current makes it possible to carry out an automatic selection of a suitable sense terminal and thus to select in each case a suitable sense terminal for the respective current range.

In accordance with one embodiment, the evaluation circuit comprises an indicator terminal designed to output a selection signal depending on the selected sense terminal. By outputting such an output signal to a suitable terminal, it is possible for the presently selected sense terminal also to be taken into account concomitantly in the further processing, and it is thus possible to deduce the current presently flowing in the power path of the semiconductor switch.

In accordance with a further embodiment of the method for determining a current in the semiconductor switch, the step for selecting a sense terminal selects one of the plurality of sense terminals depending on the currents provided at the sense terminals.

In accordance with a further embodiment, the method furthermore comprises a step for outputting a selection signal depending on the selected sense terminals.

BRIEF DESCRIPTION OF THE DRAWINGS

Further embodiments and advantages of the present invention will become apparent from the following description with reference to the accompanying figures, in which.

DETAILED DESCRIPTION

Figure 1:
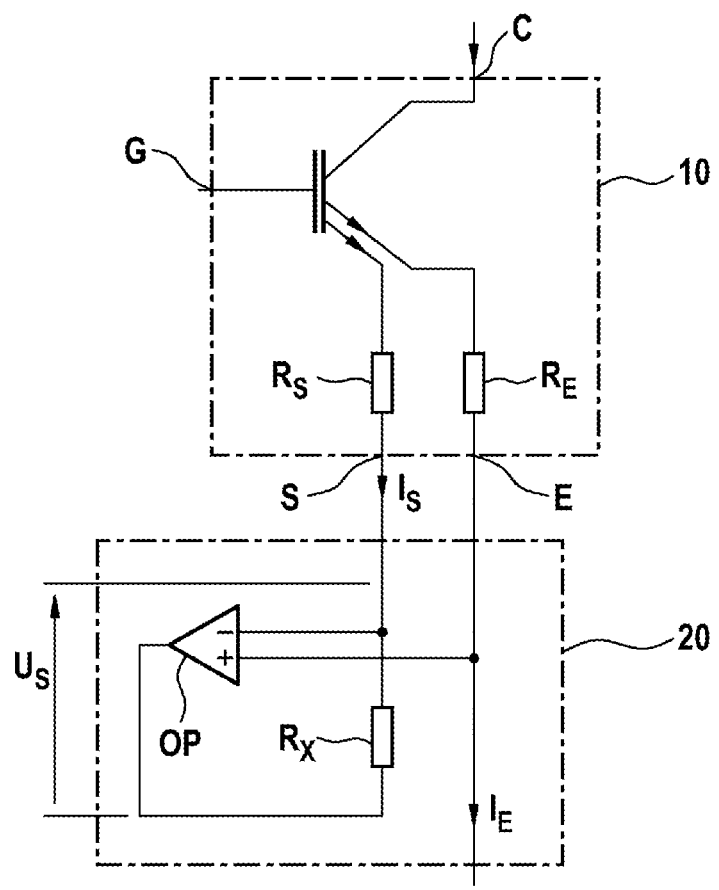
FIG. 1: shows a schematic illustration of a semiconductor switch comprising a sense terminal.

FIG. 1 shows a schematic illustration of a semiconductor switch 10 comprising a sense terminal S. The semiconductor switch 10 is embodied as an IGBT and has besides the sense terminal S an input terminal C, an output terminal E and a control terminal G. The two resistances $R_S$ and $R_E$ are the parasitic resistances in the sense path and power path, respectively. By virtue of the physical construction of the semiconductor switch, a ratio between the current in the power path $I_E$ and the current in the sense path $I_S$ results as:

$$I_E : I_S = R_E : R_S = \text{constant}$$

Therefore, in a known semiconductor switch, the current $I_E$ of the power path can be deduced from the current $I_S$ of the sense path. Since the relationship between current and voltage drop in the power and/or sense path is nonlinear, the constant ratio holds true only if the voltage between input terminal C and sense terminal S is identical to the voltage between input terminal C and output terminal E. In order to set these identical voltage ratios, a compensation circuit 20 is connected to the sense terminal S and the output terminal E, which compensation circuit sets identical voltage ratios at the sense terminal S and the output terminal E. In the exemplary embodiments illustrated here, said compensation circuit 20 comprises an operational amplifier OP, the two input terminals of which are connected to the sense terminal S and the output terminal E and which has a shunt resistor $R_x$ between the sense terminal S and the output of the operational amplifier OP. In this way, a voltage $U_S$ proportional to the current $I_S$ at the sense terminal S is present between the sense terminal S of the semiconductor switch 10 and the output of the operational amplifier OP. Consequently, in a semiconductor switch 10, for example an IGBT, comprising a sense terminal S, it is possible to provide a voltage signal $U_S$ that is proportional to the current $I_S$ at the sense terminal S and thus also proportional to the current $I_E$ at the output terminal E of the semiconductor switch 10.

Figure 2:
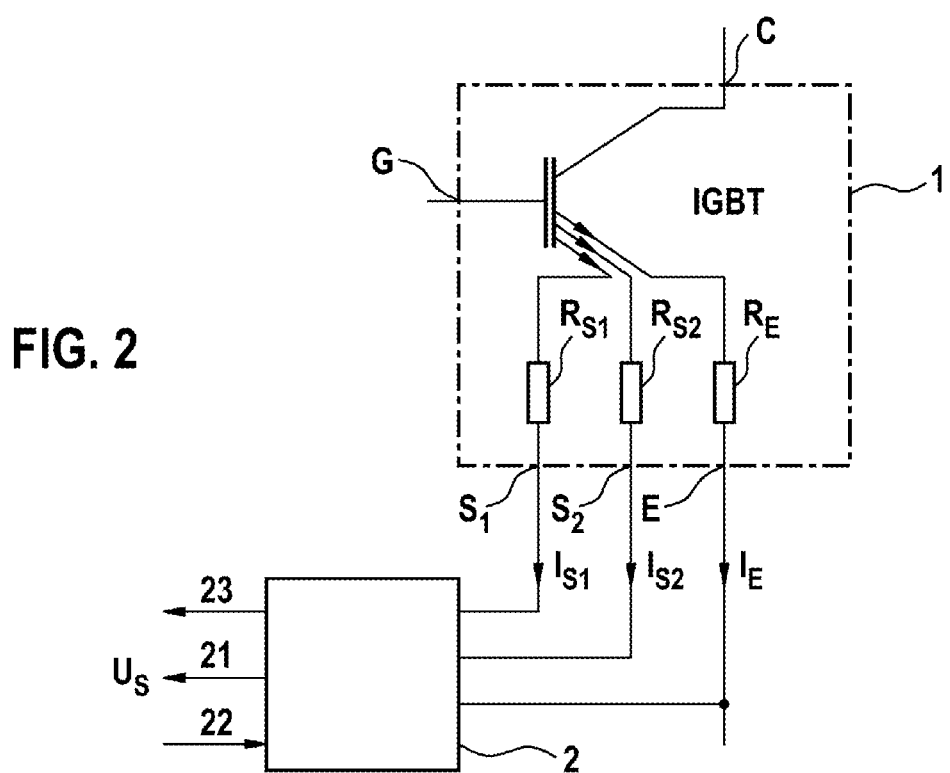
FIG. 2: shows a schematic illustration of a semiconductor switch in accordance with one exemplary embodiment.

FIG. 2 shows a schematic illustration of a semiconductor switch 1 in accordance with one embodiment of the present invention.

In this case, the semiconductor switch 1 comprises at least two sense terminals S1 and S2 besides the input terminal C and the output terminal E and the control terminal E. In this case, besides the two sense terminals S1 and S2 illustrated here, semiconductor switches 1 comprising more than two sense terminals are also possible in principle.

In this case, the output terminal E and the two sense terminals S1 and S2 are respectively assigned an individual parasitic resistance $R_E$, $R_{S1}$, $R_{S2}$. In this case, the semiconductor switch 1 comprises a multiplicity of preferably identical semiconductor switch cells. By connecting said semiconductor switch cells in parallel, it is possible to design the semiconductor switch 1 for correspondingly high currents. The ratio between the current $I_E$ in the power path of the semiconductor switch 1 and the currents $I_{S1}$, $I_{S2}$ in the paths of the two sense terminals S1 and S2 in this case results from the corresponding total areas of all the cells of the corresponding terminals. In this case, the output signals of the sense terminals S1 and S2 are fed to an evaluation circuit 2. Said evaluation circuit 2 is furthermore also connected to the output terminal E of the semiconductor switch 1.

The evaluation circuit 2 selects at least one of the sense terminals S1, S2 and in this case adjusts the current at the selected sense terminal S1, S2 such that identical voltage ratios are set between the selected sense terminal S1, S2 and the output terminal E of the semiconductor switch 1. On account of the different designs of the two sense terminals S1, S2, in this case a different current $I_{S1}$ or $I_{S2}$ is established in the evaluation circuit 2 depending on the selected sense terminal S1 or S2. In order to optimize the measured value detection of the current $I_E$ in the power path of the semiconductor switch 1, for example in the case of a low current $I_E$ in the power path of the semiconductor switch 1 it is possible to select a sense terminal S1, S2 which leads to a relatively high sense current $I_{S1}$, $I_{S2}$, while in the case of relatively high currents $I_E$ in the power path of the semiconductor switch 1 a sense terminal S1, S2 that leads to a relatively low sense current $I_{S1}$, $I_{S2}$ is preferably selected.

In this case, the selection of a suitable sense terminal S1, S2 may be carried out automatically in the evaluation circuit 2. By way of example, the evaluation circuit 2 may select one of the sense terminals S1, S2 on the basis of the current value presently determined. For example, a sense terminal S1, S2 that was optimized for a low current may firstly be selected. If the current exceeds a predetermined threshold value in this case during the evaluation, it is thereupon possible to carry out a switch-over to a different sense terminal S1, S2, which was optimized for a higher current value. If more than two sense terminals are available, it is thereupon possible also to change to a further sense terminal in the event of a further threshold value being exceeded. Furthermore, in the event of a predefined threshold value being undershot it is also possible to change to a different sense terminal, designed for lower currents. Consequently, it is possible to select adaptively in each case a sense terminal that is well suited to the determination of the present current in the power path.

As a result of the evaluation of the respectively selected sense terminal S1, S2 in the evaluation circuit 2, a voltage signal $U_S$ that is proportional to the current $I_E$ in the power path of the semiconductor switch at least in the range provided therefor is thereupon generated in the evaluation circuit 2. Said voltage signal $U_S$ is provided at an output terminal 21 of the evaluation circuit 2. Preferably, said voltage signal $U_S$ is provided in this case in the form of an analogue voltage value. Alternatively, however, it is also possible, in the evaluation circuit 2, after the determination of the current $I_E$ in the power path of the semiconductor switch 1, to digitize the determined value of the current and thereupon to provide a digital signal as output signal at the output terminal 21.

As an alternative to an automatic change between the sense terminals S1, S2 it is likewise possible, by means of a further signal at an input 22 of the evaluation circuit 2, to select the respective sense terminal S1, S2 externally and thus to select a specific sense terminal S1, S2 in each case for the subsequent evaluation. If the semiconductor switch 1 has two sense terminals S1, S2, for example, then a respective one of the two sense terminals S1, S2 can be selected for example depending on a high or low potential at the input 22 of the evaluation circuit 2. Furthermore, further, alternative signals in the form of analogue or digital signals are also possible in particular also in the case of more than two sense terminals S1, S2.

In order, in the case of an automatic or alternatively in the case of a manual selection of the individual sense terminals S1, S2 for a downstream further processing, in each case also to obtain information about the presently selected sense terminal S1, S2, the evaluation circuit 2 may also have a further indicator terminal 23, which in each case provides a signal dependent on the presently selected sense terminal S1, S2. Here, too, for example with only two sense terminals S1, S2 present, a corresponding signaling may be effected by a suitable high or low level. Furthermore, it goes without saying that any other analogue or digital signaling for the indication of the sense terminal respectively selected are also possible.

Figure 3:
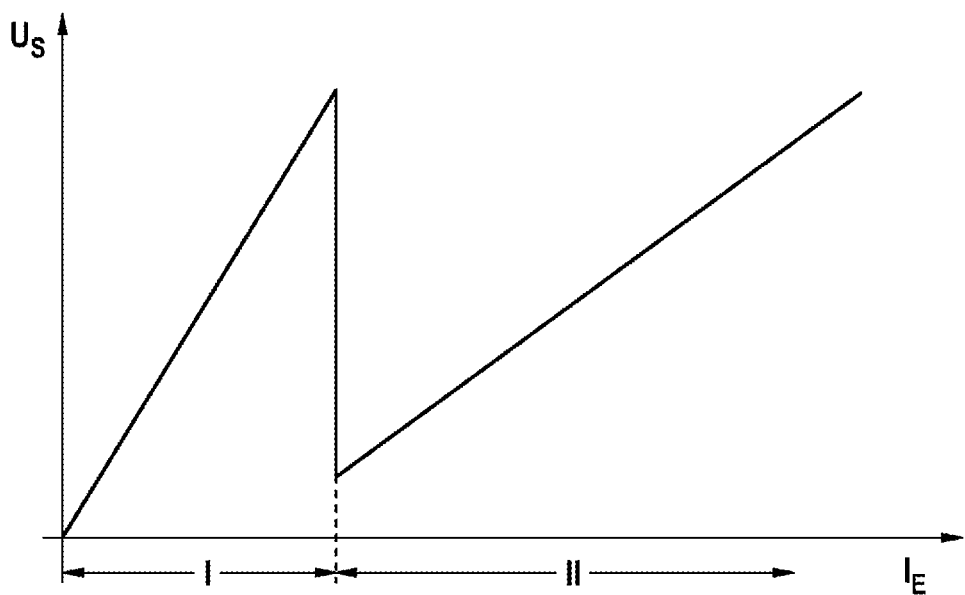
FIG. 3: shows a schematic illustration of a current-voltage diagram such as underlies one exemplary embodiment.

FIG. 3 shows a schematic illustration of a current-voltage diagram for a signal characteristic curve such as underlies one exemplary embodiment of the present invention. In a first range I, in this case firstly a first sense terminal S1 is selected, which is designed for a relatively low current $I_E$ in the power path of the semiconductor switch 1. In this case, a voltage signal $U_S$ proportional to the current $I_E$ in the power path of the semiconductor switch 1 is output during this first range I. In the transition from the range I to the range II, a switch-over to a second sense terminal S2 is carried out. Said second sense terminal S2 is designed for higher currents. As can be discerned in FIG. 3, the transition of the current-voltage line is not continuous at this point. Since in the range II for relatively high currents the evaluation circuit 2 outputs voltages $U_S$ which could likewise also correspond to a lower current $I_E$ in a first range, an unambiguous assignment of the current $I_E$ in the power path of the semiconductor switch 1 is thus not possible solely on the basis of the output voltage $U_S$. Therefore, in this case a further consideration of the additional indicator signal at the indicator terminal 23 is necessary, said signal indicating the sense terminal S1, S2 respectively selected. The current $I_E$ in the power path of the semiconductor switch 1 can then be deduced by means of the common evaluation of voltage signal $U_S$ and indicator signal.

Figure 4:
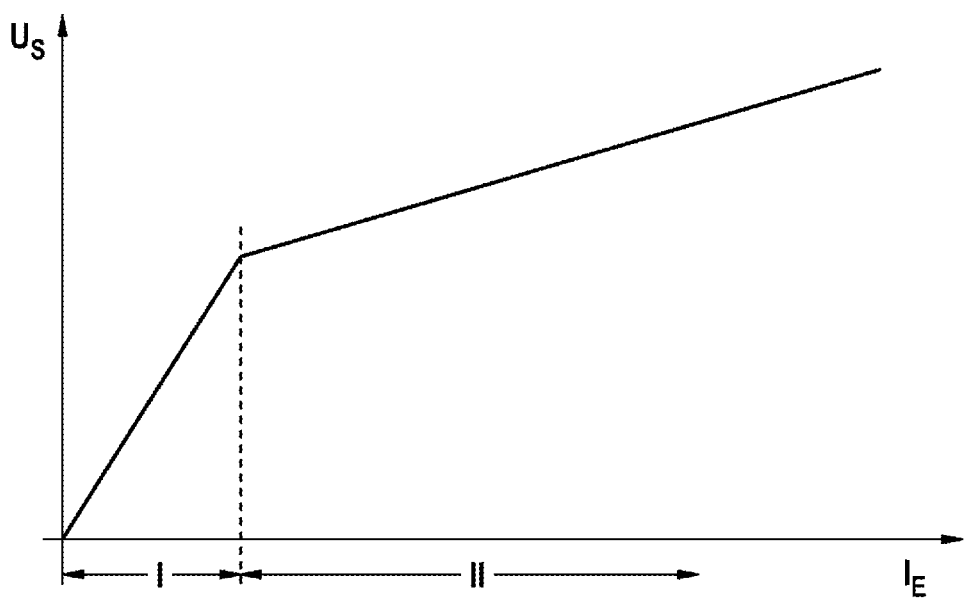
FIG. 4: shows a schematic illustration of a current-voltage diagram such as underlies a further exemplary embodiment.

FIG. 4 shows an alternative current-voltage characteristic curve in accordance with a further embodiment. In the case of this current-voltage characteristic curve, a continuous transition in the current-voltage characteristic curve takes place upon the switch-over from a first sense terminal S1 to a second sense terminal S2. In this case, however, the gradient in the second range II may deviate from the gradient in the first range I. Since in this case an unambiguous assignment of the output signal $U_S$ to the corresponding current $I_E$ in the power path of the semiconductor switch 1 can take place over the entire measurement range, it is possible here to dispense with the further evaluation of the indicator signal at the indicator terminal 23 for indicating the sense terminal respectively selected.

Figure 5:
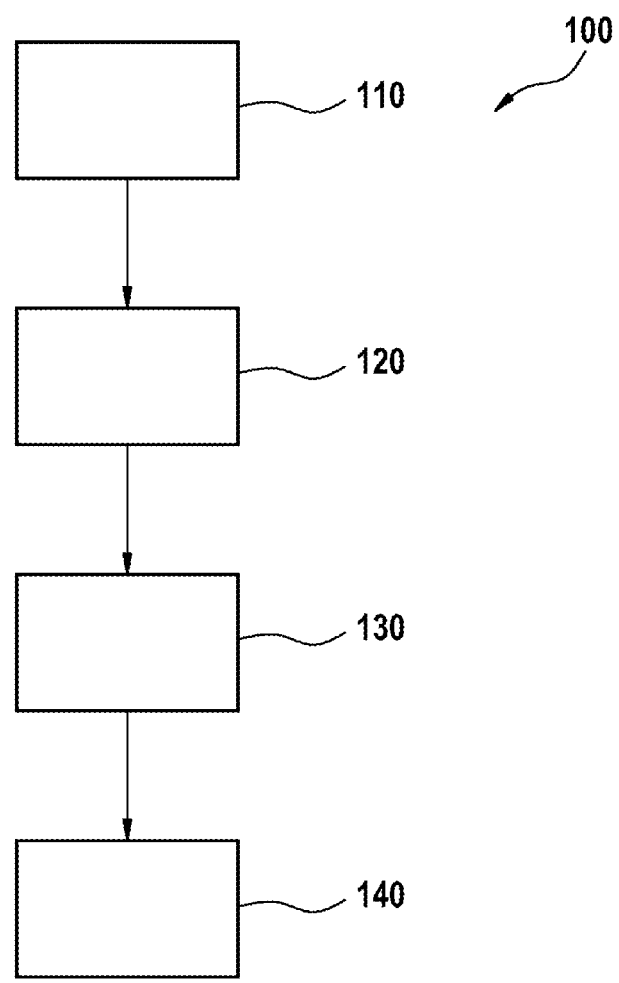
FIG. 5: shows a schematic illustration of a flow diagram such as underlies a further embodiment of the present invention.

FIG. 5 shows a schematic illustration of a flow diagram such as underlies a method 100 for determining a current $I_E$ between an input terminal C and an output terminal E of a semiconductor switch 1. In step 110, firstly a semiconductor switch 1 comprising a plurality of sense terminals S1, S2 is provided, wherein the sense terminals S1, S2 are designed in each case to provide a current $I_{S1}$, $I_{S2}$ that is proportional to the current $I_E$ flowing between the input terminal C and the output terminal E. In step 120, from the plurality of sense terminals S1, S2 one of these sense terminals S1, S2 is selected. In step 130, a voltage signal $U_S$ is thereupon output using the current $I_{S1}$, $I_{S2}$ provided at the selected sense terminal S1, S2.

face In this case, in step 120 for selecting a sense terminal S1, S2 from the plurality of sense terminals, a sense terminal S1 or S2 may be selected depending on a current $I_{S1}$ or $I_{S2}$ provided at the sense terminals.

Furthermore, the method may have a step 140 of outputting a suitable selection signal depending on the selected sense terminal S1, S2.

To summarize, the present invention relates to a semiconductor switch and a method for determining a current in the power path of a semiconductor switch. For this purpose, a semiconductor switch is proposed which has a plurality of sense terminals, wherein each of said sense terminals supplies an individual output signal that is proportional to the current in the power path of the semiconductor switch. By means of a suitable selection of one of the plurality of sense terminals depending on the current in the power path of the semiconductor switch, it is possible to optimize the evaluation of the current in the power path.

The invention claimed is:
1. A semiconductor switch (1), comprising:
an input terminal (C);
an output terminal (E);
a control terminal (G) configured to set a current ($I_E$) between the input terminal (C) and the output terminal (E) based on a voltage signal present at the control terminal (G);
a plurality of sense terminals (S1, S2) configured to provide currents ($I_{s1}$, $I_{s2}$) that are proportional to the current ($I_E$) flowing between the input terminal (C) and the output terminal (E), and
an evaluation circuit (2) configured to output a voltage signal ($U_s$) using at least one of the currents ($I_{s1}$, $I_{s2}$) provided by the plurality of sense terminals (S1, S2), wherein the evaluation circuit (2) comprises a control terminal (22), and the evaluation circuit (2) is configured to select one of the plurality of sense terminals (S1, S2) based on a signal present at the control terminal (22), and wherein the voltage signal ($U_s$) is output using the current ($I_{s1}$, $I_{s2}$) from the selected sense terminal (S1, S2).

2. The semiconductor switch (1) as claimed in claim 1, wherein the currents ($I_{s1}$, $I_{s2}$) provided at the plurality of sense terminals (S1, S2) are different.

3. The semiconductor switch (1) as claimed in claim 1, wherein the semiconductor switch (1) is an insulated gate bipolar transistor.

4. The semiconductor switch (4) as claimed in claim 1, wherein the evaluation circuit (2) is configured to select one of the plurality of sense terminals (S1, S2) depending on the current ($I_{s1}$, $I_{s2}$) output at the sense terminals (S1, S2).

5. The semiconductor switch (1) as claimed in claim 4, wherein the evaluation circuit (2) comprises an indicator terminal (23) configured to output a selection signal depending on the selected sense terminal (S1, S2).

6. A method (100) for determining a current between an input terminal (C) and an output terminal (E) of a semiconductor switch (1), comprising the following steps: providing (110) a semiconductor switch (1) comprising a plurality of sense terminals (S1, S2) configured to provide currents ($I_{s1}$, $I_{s2}$) that are proportional to the current ($I_E$) flowing between the input terminal (C) and the output terminal (E); selecting (120) one of the plurality of sense terminals (S1, S2); outputting (130) a voltage signal ($U_s$) using the current ($I_{s1}$, $I_{s2}$) provided at the selected sense terminal (S1, S2).

7. The method (100) as claimed in claim 6, wherein step (120) for selecting a sense terminal (S1, S2) selects one of the plurality of sense terminals (S1, S2) depending on the currents ($I_{s1}$, $I_{s2}$) provided at the sense terminals (S1, S2).

8. The method (100) as claimed in claim 6, further comprising a step (140) for outputting a selection signal based on the selected sense terminal.

* * * * *